United States Patent
Ho et al.

(10) Patent No.: US 8,865,523 B2
(45) Date of Patent: Oct. 21, 2014

(54) SEMICONDUCTOR PACKAGE AND FABRICATION METHOD THEREOF

(71) Applicants: Yueh-Se Ho, Sunnyvale, CA (US); Yan Xun Xue, Los Gatos, CA (US); Jun Lu, San Jose, CA (US); Lei Shi, Shanghai (CN); Liang Zhao, Shanghai (CN); Ping Huang, Shanghai (CN)

(72) Inventors: Yueh-Se Ho, Sunnyvale, CA (US); Yan Xun Xue, Los Gatos, CA (US); Jun Lu, San Jose, CA (US); Lei Shi, Shanghai (CN); Liang Zhao, Shanghai (CN); Ping Huang, Shanghai (CN)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 13/833,341

(22) Filed: Mar. 15, 2013

(65) Prior Publication Data

US 2014/0264805 A1   Sep. 18, 2014

(51) Int. Cl.
*H01L 23/495* (2006.01)
*H01L 21/78* (2006.01)

(52) U.S. Cl.
CPC .............. *H01L 23/495* (2013.01); *H01L 21/78* (2013.01)
USPC ........... 438/111; 438/106; 438/112; 438/119; 438/121; 438/122; 438/123; 438/127

(58) Field of Classification Search
CPC ... H01L 21/02016; H01L 21/02; H01L 24/34; H01L 2224/96; H01L 2924/18301; H01L 21/28; H01L 21/56; H01L 24/36; H01L 24/37; H01L 24/84
USPC ......... 438/106, 111, 112, 119, 121, 122, 123, 438/127
See application file for complete search history.

(56) References Cited

U.S. PATENT DOCUMENTS

| | | | |
|---|---|---|---|
| 7,786,558 B2 * | 8/2010 | Otremba ....................... 257/678 |
| 2001/0048116 A1 * | 12/2001 | Standing et al. .............. 257/177 |
| 2003/0216009 A1 * | 11/2003 | Matsuura et al. ............. 438/460 |
| 2012/0235289 A1 * | 9/2012 | Xue et al. ...................... 257/676 |

* cited by examiner

*Primary Examiner* — Peniel M Gumedzoe
(74) *Attorney, Agent, or Firm* — Chein-Hwa Tsao; CH Emily LLC

(57) ABSTRACT

A method of making a semiconductor packaged device comprises mounting onto a lead frame a bottom of a molded semiconductor chip having a first plastic package body covering a top face of a semiconductor chip, encapsulating the lead frame and the semiconductor chip with a second plastic package body with top surfaces of conductive contact bodies electrically connected to electrodes on the top surface of the semiconductor chip exposed and plating conductive pads on a top surface of the assembly structure to provide external electrical connections to the electrodes through the conductive contact bodies.

8 Claims, 11 Drawing Sheets

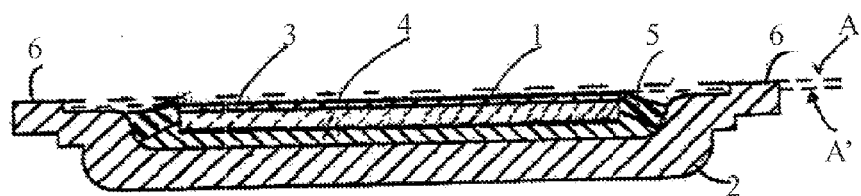
FIG. 1 - PRIOR ART
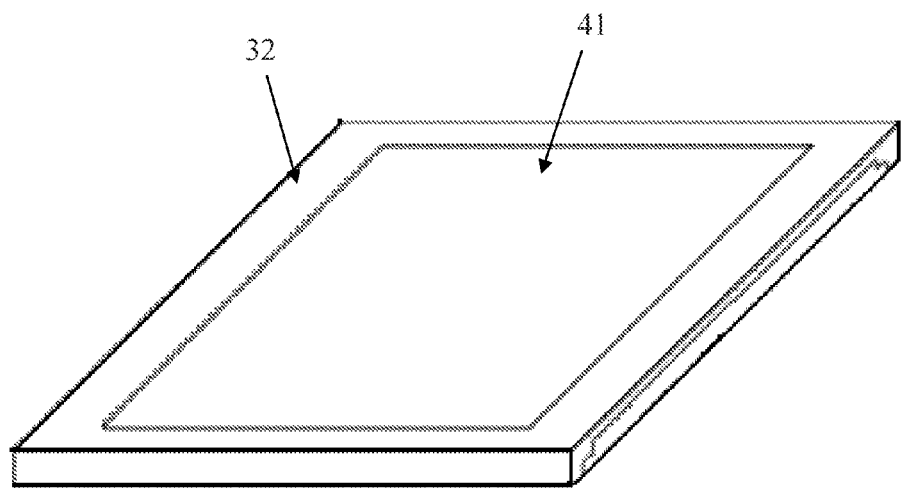
FIG. 2

US 8,865,523 B2

SEMICONDUCTOR PACKAGE AND FABRICATION METHOD THEREOF

FIELD OF THE INVENTION

The invention relates to a semiconductor package, particularly relates to a package structure with a molded semiconductor chip and a fabrication method thereof

DESCRIPTION OF THE RELATED ART

FIG. 1 is a schematic diagram of a conventional semiconductor package. The bottom drain of a MOSFET chip 1 is attached on a bottom base of a cup-shaped lead frame 2 by conductive adhesive 4 with the edges of the MOSFET being spaced from the walls of the cup-shaped lead frame 2. The lead frame 2 is made of metal alloy or other conductive material. The space between the edges of the MOSFET 1 and the walls in the lead frame 2 is filled with an insulating layer 5. The lead frame 2 also includes two pins 6 located on two of its opposing edges at its top surface electrically connected to the drain on the bottom of the MOSFET chip 1 for electrical connection to the external device.

In addition, as shown in FIG. 1, a top surface 3 of the MOSFET 1 as indicated by plane A' is sub-flush below the plane A of the top surfaces of the pins 6 of the lead frame 2, thus the temperature cycling failures is reduce and the heat dissipation of the semiconductor package in FIG. 1 is improved. However, strict alignment in mounting the semiconductor chip onto the lead frame is required to control the top surfaces of each electrode on a same plan thus increase the assembly cost. Further the semiconductor chip must maintain a certain thickness such that the chip will not deform during assembly process.

BRIEF DESCRIPTION OF THE DRAWINGS

FIG. 1 is a schematic diagram of the prior art semiconductor device packaging structure;

FIG. 2 and FIG. 3 are the schematic diagrams of the front and the back views of the packaging structure respectively of this invention;

DETAILED DESCRIPTION OF THE PREFERRED EMBODIMENTS

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

Figure 3:
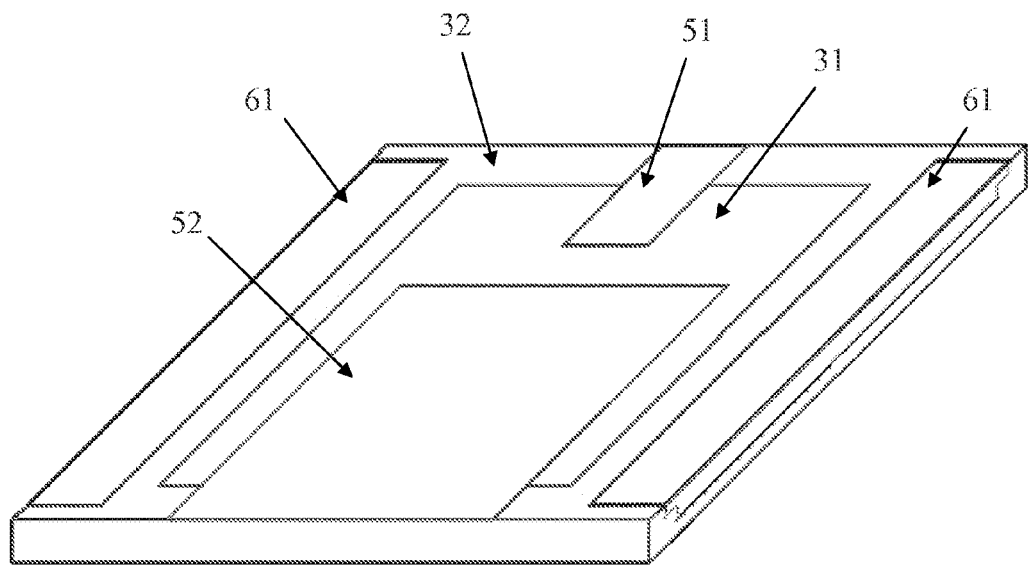

FIG. 2 and FIG. 3 are perspective top and bottom views respectively of a semiconductor package of the present invention. As shown in FIG. 3, a source pad 52, a gate pad 51 and two drain pads 61, which are separated from each other, are exposed on a bottom surface of the package, and a top source terminal 12, a top gate terminal 11 and a bottom drain terminal 13 of the MOSFET 10 (FIG. 4) are electrically connecting to the other external devices (such as another semiconductor chip or integrated circuit board and the like) by these pads respectively. Meanwhile, the bottom surface of a lead frame 40 (FIG. 9) in connection with the bottom drain terminal 13 of the chip 10 is exposed on a top surface of the package (FIG. 2) for improving the heat dissipation of the device.

Embodiment 1

Figure 4:
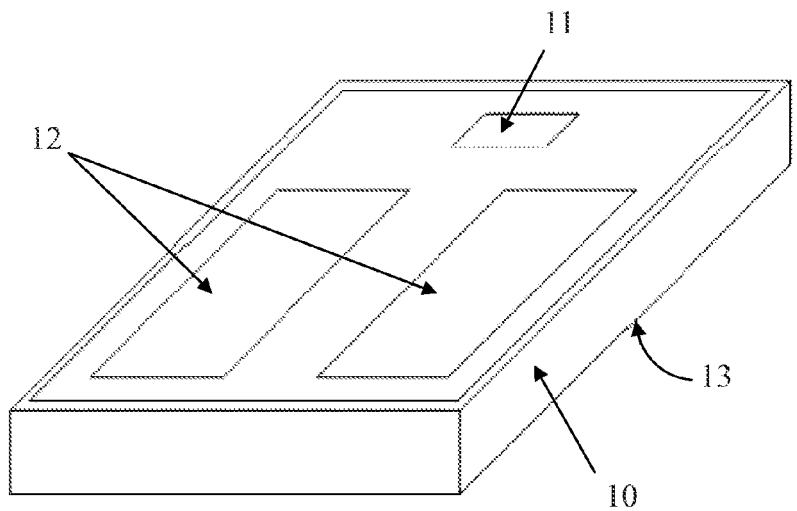
FIG. 4 to FIG. 12 are the schematic structural diagrams corresponding to various steps of a first fabrication method of the packaging structure in the invention.
Figure 5:
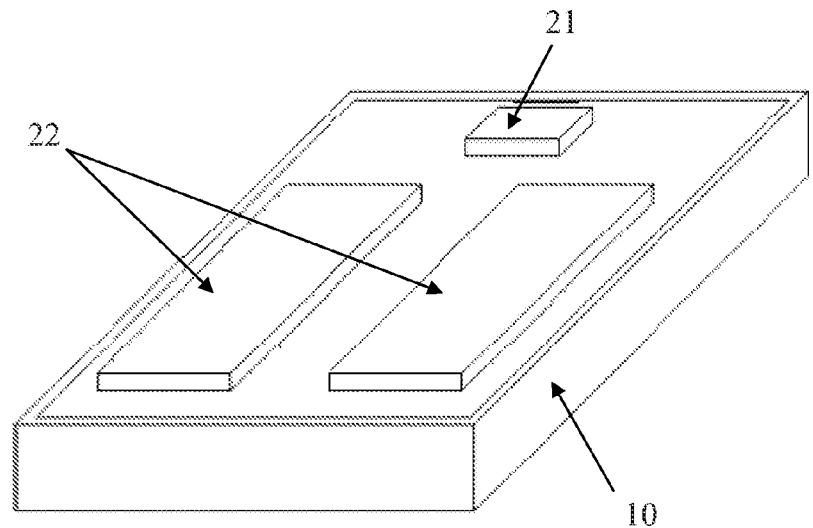

FIG. 4 to FIG. 12 illustrate a fabrication method of the semiconductor package according to a first embodiment of the present invention. FIG. 4 is a perspective view of one of a plurality of semiconductor chips 10 formed on a top surface of a semiconductor wafer (not shown). In the embodiment as shown in FIG. 4, each chip 10 is a MOSFET chip including a top gate terminal 11 and top source terminal 12 separated from each other and formed on the top surface of the chip, and a bottom drain terminal 13 formed on the bottom surface of the chip. As shown in FIG. 5, conductive contact bodies 21 and 22, such as metal balls or metal bumps, formed on the top gate terminal 11 and the top source terminal 12 of each chip 10 for electrically connecting with the external devices. Certain common materials in current technologies can be used for forming the contact bodies 21 and 22, such as copper, tin, lead, and the likes.

Figure 6:
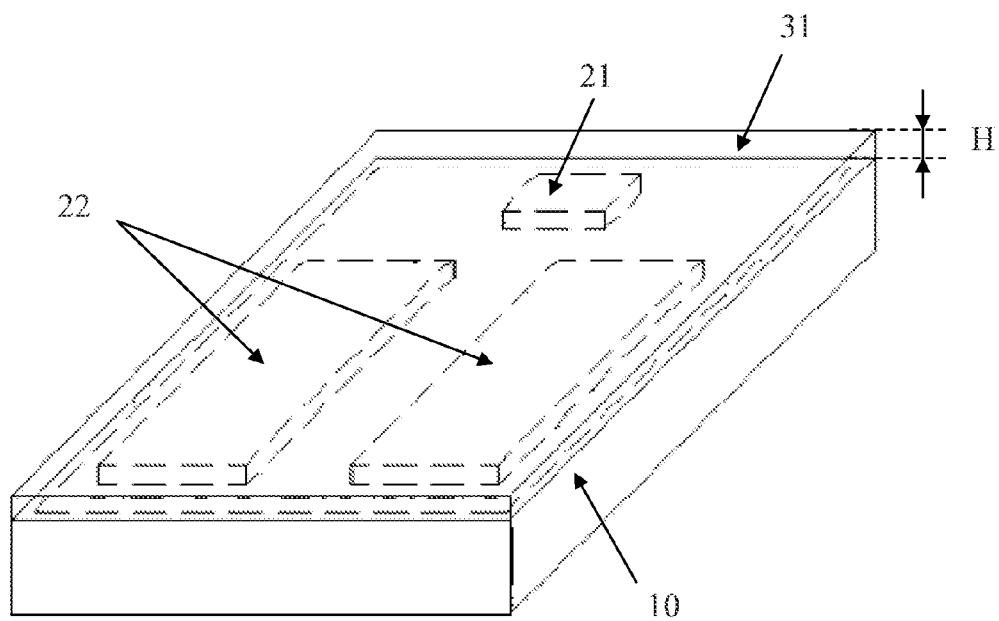
Figure 7:
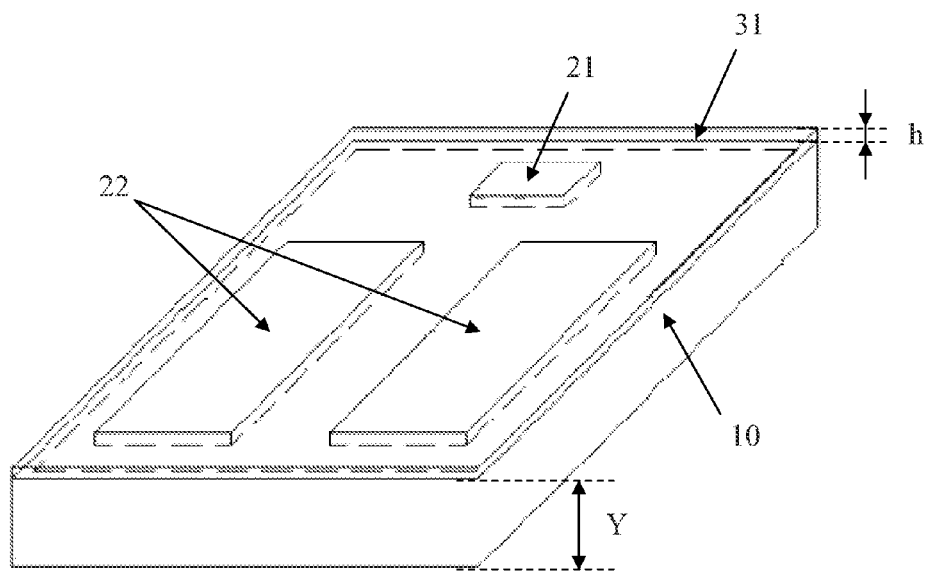
Figure 8:
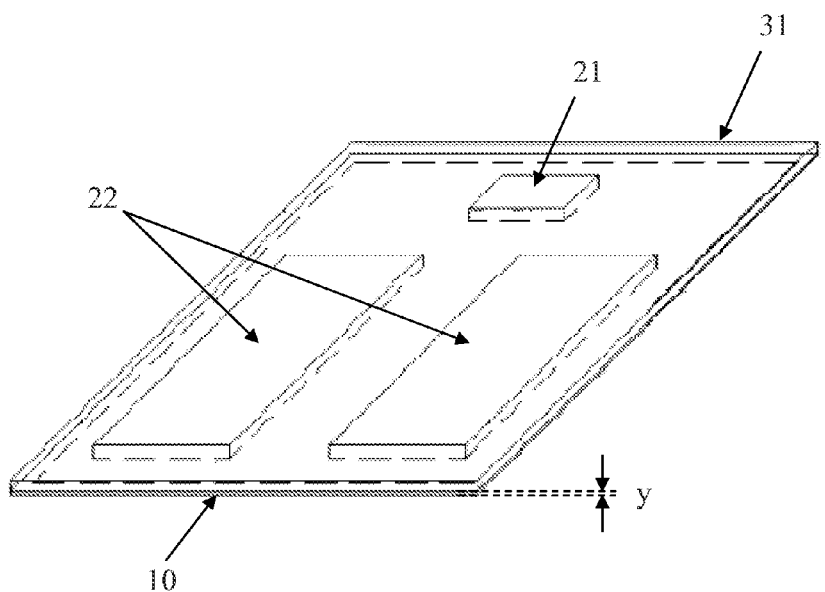

As shown in FIG. 6, a first plastic package body 31 with a big enough thickness H is formed for covering the top surface of each chip 10 and completely encapsulating the contact bodies 21 and 22 on the top surface of the chip 10. As shown in FIG. 7, the first plastic package body 31 is ground from its top surface to a smaller thickness h until the top surface of the contact bodies 21 and 22 is exposed. At this time, the top surfaces of the contact bodies 21 and 22 are flush with the top surface of the first plastic package body 31. Alternatively, after the contact bodies 21 and 22 are exposed, the top surfaces of the first plastic package body 31 and the contact bodies 21 and 22 can be further ground until reaching a predetermined thickness. As shown in FIG. 8, the molded wafer or the chip 10 with an original semiconductor substrate thickness Y is ground from its bottom surface to a smaller thickness y, for example, the thickness y of the ground wafer may be 1 mil or thinner, which can be considered as a substrate-less level without the concern of mechanical deformation in following processes due to the mechanical support of the first plastic package body. At this stage, the molded wafer is singulated into a plurality of individual molded chips 10, each of which includes a semiconductor chip, as shown in FIG. 8. The top surface of the chip is covered with the first plastic body while the sidewalls of the chip are exposed and flush with the sidewalls of the first plastic body. Alternatively, a metal deposition can be carried out on the bottom surface of the ground wafer before singulation.

Figure 9:
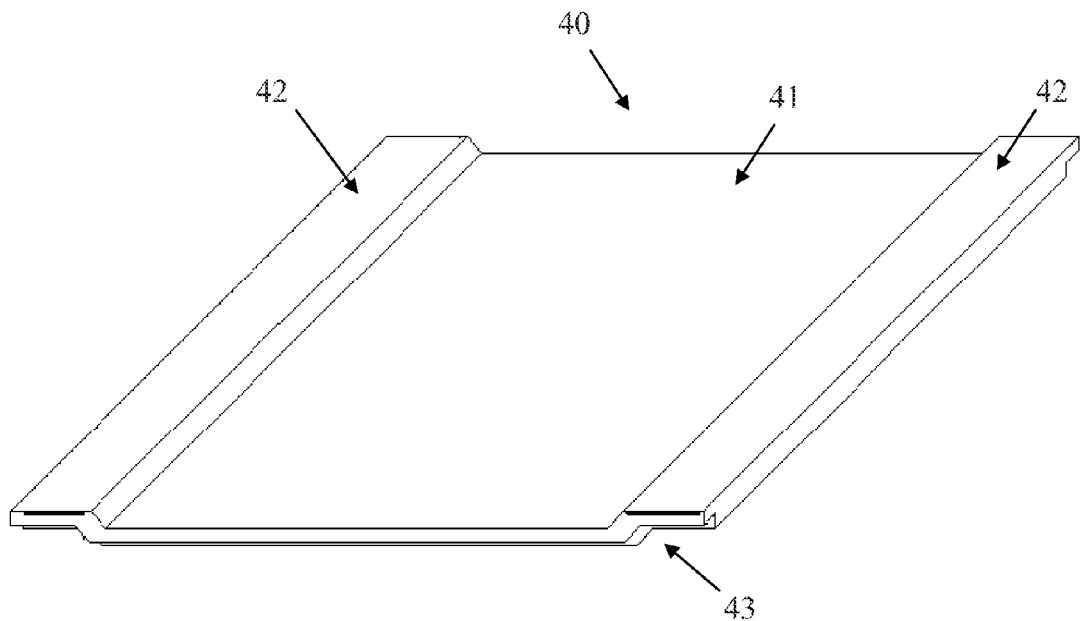

FIG. 9 is a perspective view of a conductive lead frame 40 made of a metal, such as copper and the like or metal alloy material. The lead frame 40 includes a die paddle 41 and two contact parts 42 relatively connected to two opposite edges bent upward at the first side and the third side corresponding to the left side and the right side of the die paddle 41, where the top surface of the two contact parts 42 is higher than the top surface of the die paddle 41. In addition, the lead frame 40 also includes notches 43 at the bottom surface of four corners of the lead frame 40 formed by a half-etch process.

Figure 10:
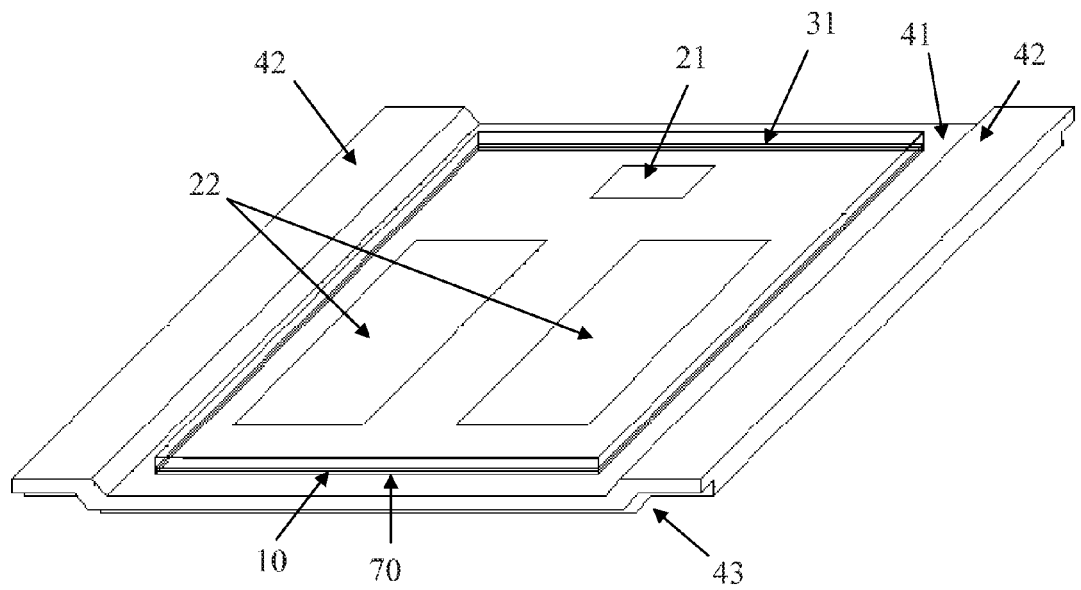

As shown in FIG. 10, the bottom surface of the molded chip 10 is attached on the top surface of the die paddle 41 by a conductive adhesive 70. As such, the bottom drain terminal 13 of the molded chip 10 is directly electrically connected to the top surface of the die paddle 41 of the lead frame 40, and therefore electrically connected to the two contact parts 42 through the die paddle 41. The surface area of the die paddle 41 of the lead frame 40 needs to be larger than that of the molded chip 10, therefore there is a space between the edge of the molded chip 10 and that of the die paddle 41.

Figure 11:
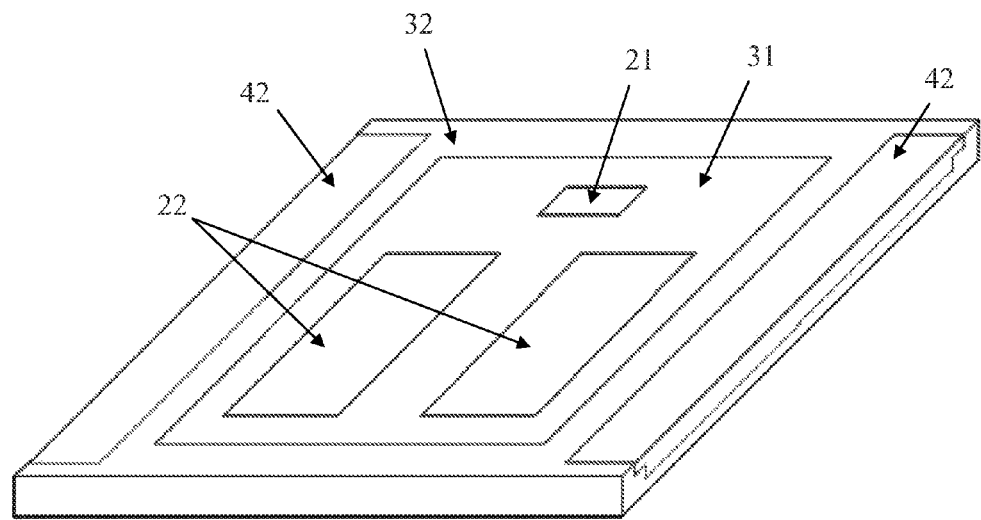

As shown in FIG. 11, a second plastic package body 32 is formed on the top surface of the lead frame 40 to cover the side surface of the molded chip 10. The material of the second plastic package body 32 may be the same as that of the first plastic package body 31 or different. In this figure, the edge line of the molded chip 10 is only displayed for showing the position of the molded chip 10 in the package. Specifically, refer to FIG. 11, the space between the edges of the molded chip 10 and the edges of the dies paddle 41 is filled by the second plastic package body 32. The second plastic package body 32 also covers the bottom surface of the contact parts 42, the side surfaces of the second side and the fourth side of the lead frame 40 and fills the notches 43 with the contact bodies 21 and 22 at the top source terminal 12 and the top gate terminal 11 of the molded chip 10 being exposed outside of the second plastic package body 32. The top surface and the side surface of the two contact parts 42 on the first side and the third side of the lead frame 40 are also exposed from the second plastic package body 32 for electrically connecting with the external devices.

In this packaging step, the top surface of the molded chip 10 is covered with an adhesive tape before forming the second plastic package body 32 to control the thickness of the second plastic package body 32 during packaging and to protect the top surface of the contact bodies 21 and 22 and the contact part 42 that need to expose after forming the second plastic package body 32. After forming second plastic package body 32, the adhesive tape is removed, and second plastic package body 32 at the top surface of the packaging structure is de-flashed or slightly ground to remove the residual packaging material, so that the top surface of the packaging structure is flat and the top surfaces of the contact bodies 21 and 22 and the contact part 42 are exposed from the second plastic package body 32. At this time, the top surfaces of the contact bodies 21 and 22, the contact part 42 and the second plastic package body 32 are preferably coplanar but not strictly required.

In addition, as shown in FIG. 2, the second plastic package body 32 covers the bottom surfaces of the two contact parts 42 of the lead frame 40. The bottom surface of the die paddle 41 can be completely or partially exposed from the second plastic package body 32 by covering the bottom surface of the die paddle 41 with an adhesive tape before forming the second plastic package body 32 or grinding the bottom surface of the second plastic package body 32 after packaging. As such, the bottom surfaces of the die paddle 41 and the second plastic package body 32 are also coplanar. The exposed bottom surface of the die paddle 41 improves the heat dissipation of the devices or can be used for the electrical connection between the drain terminal 13 at the bottom of the chip 10 to the external devices.

Solderable metal pads are plated on the top surface of the packaging structure at the top surfaces of contact bodies 21 and 22 and the contact part 42 to re-pattern the package external connection between the corresponding terminal on the chip 10 and the external device. The location of the plated metal pads on the top surface of the packaging structure depends on the desired application of the device. In the example shown in FIG. 12, a metal pad 52 is plated on top of the contact bodies 22 on the two top source terminals 12 of the chip 10 and can be used as a source contact pad 52. Similarly, a metal pad 51 is plated over the contact body 21 on the gate terminal 11 of the chip 10 and can be used as a gate contact pad 51, and the metal pads 61 are plated on the contact parts 42 and can be used as a drain contact pads 61, where the drain contact pads 61 extend to the edges of the first side and the third side of the lead frame. In addition, the gate contact pad 51 covers a portion of the top surface of the first and/or second plastic body and extends to the edge of the second side of the packaging structure but terminates far away from the edges of the first side and the third side of the lead frame, and the source contact pad 52 covers a portion of the top surface of the first and/or second plastic body and extends to the edge of the fourth side of the packaging structure but terminate far away from the edges of the first side and the third side of the lead frame, where the contact pads 51, 52 and 61 are electrically separated from each other. The plastic package body 32 surrounds four side surfaces of the molded chip 10 and extends to and covers the side surfaces of the second side and the fourth side of the lead frame 40, and the gate contact pad 51 and the source contact pad 52 respectively covers parts of top surface of the plastic package body 32 and extends to the edges of the second side and the fourth side of the packaging structure beyond the corresponding edges of the lead frame while the contact pad 61 terminates at a distance away from both the edges of the second side and the fourth side of the packaging structure.

Embodiment 2

FIG. 13 to FIG. 21 are perspective schematic diagrams showing a second fabrication method of the packaging structure of the invention.

Figure 13:
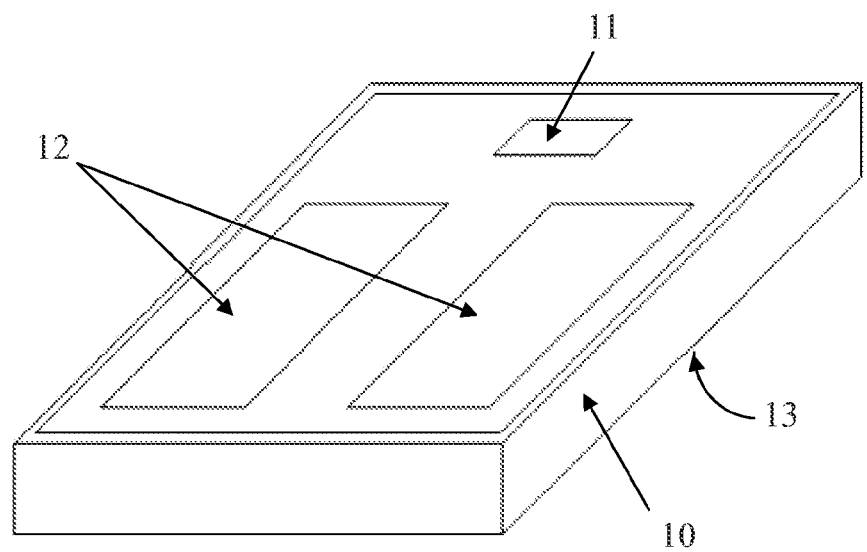
FIG. 13 to FIG. 21 are the schematic structural diagrams corresponding to various steps of a second fabrication method of the packaging structure in the invention.
Figure 14:
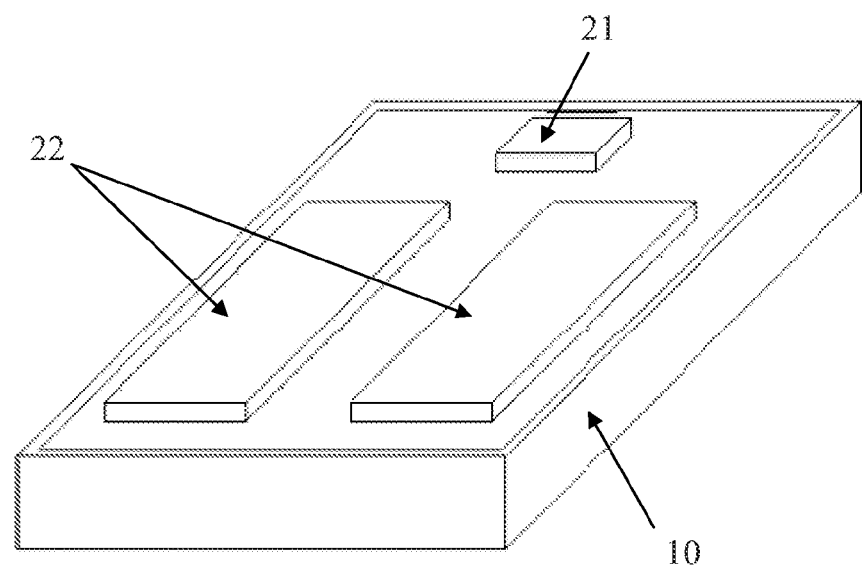
Figure 15:
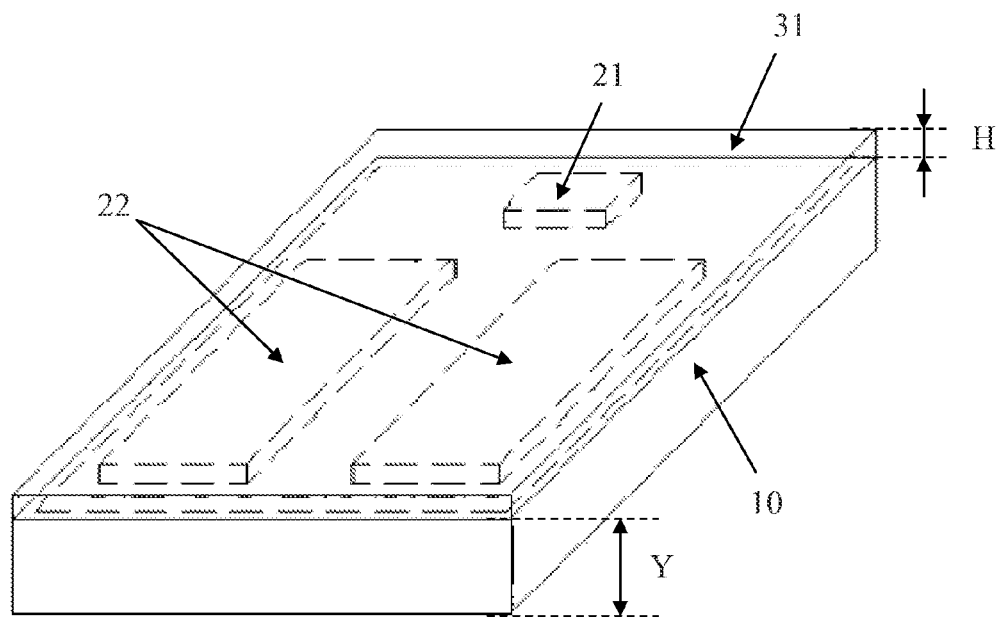

FIG. 13 to FIG. 15 are similar to FIG. 4 to FIG. 6, in which a plurality of MOSFET chips are formed on a front surface of the wafer and the contact bodies 21 and 22 are formed on the top gate terminal 11 and the top source terminal 12 of each chip 10 respectively, then a first plastic package body 31 is formed with a big enough thickness H to cover the top surface of the chip 10 with contact bodies 21 and 22 being completely encapsulated.

Figure 16:
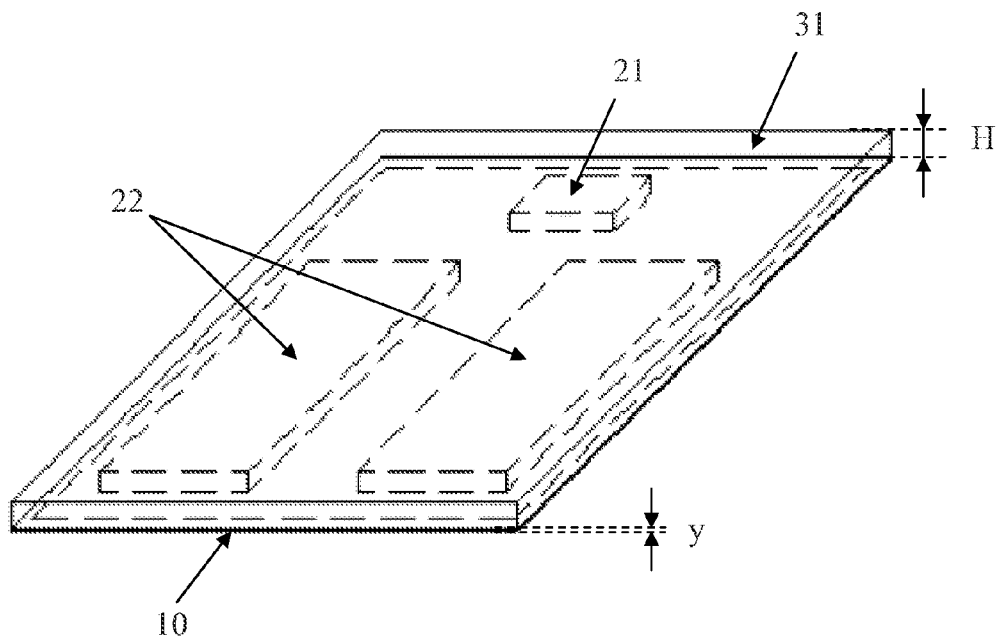

In this process, as shown in FIG. 16, the top surface of the first plastic package body 31 is not ground to exposed the contact bodies 21 and 22. The wafer or the chip 10 with an original semiconductor substrate thickness Y is ground from its bottom surface to a smaller thickness y, which can be considered as a substrate-less level. The thickness y of the ground wafer is 1 mil or thinner. And then, the wafer is cut into individual molded chips 10, each of which includes a semi-conductor chip with top surface of the chip covered by the first plastic package body while the sidewalls of the chip are exposed and flush with the sidewalls of the first plastic body, as shown in FIG. 16. Back metal deposition to the ground molded wafer bottom surface is optional before cutting the wafer.

Figure 17:
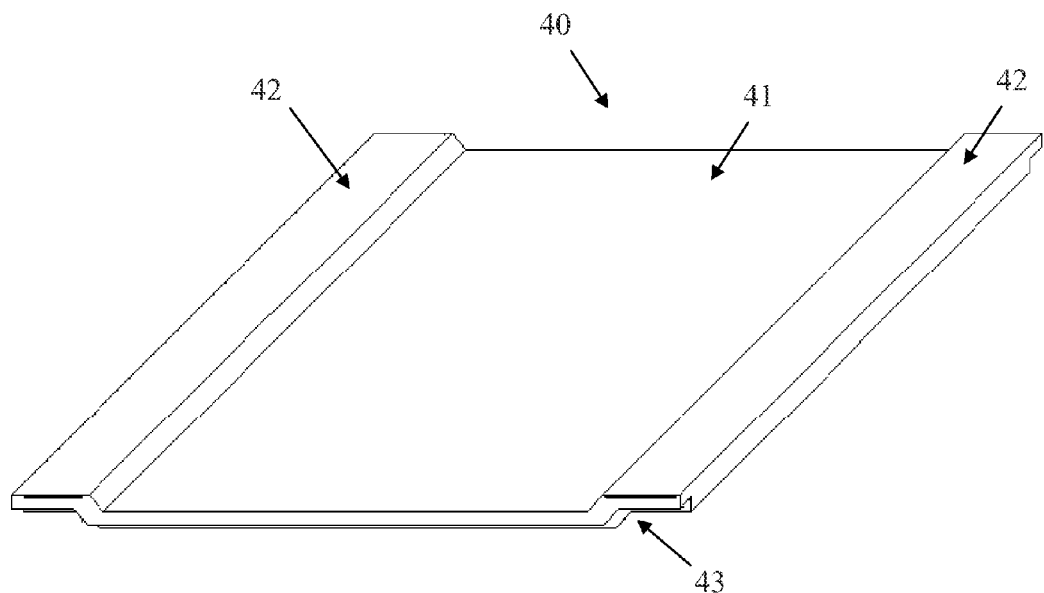
Figure 18:
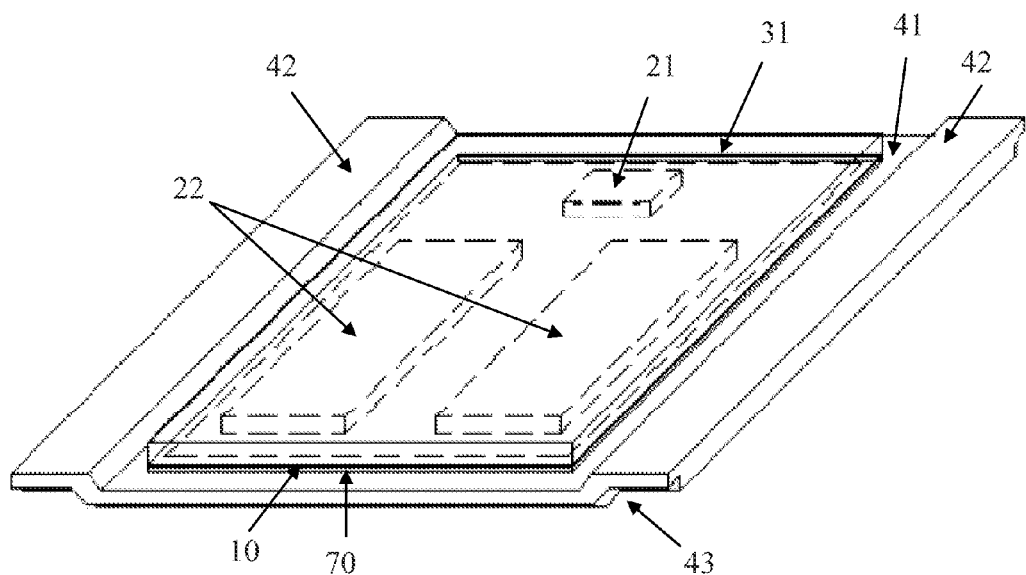

FIG. 17 shows a lead frame similar as that shown in FIG. 9. As shown in FIG. 18, the bottom surface of the molded chip 10 is attached on the top surface of the die paddle 41 by a conductive adhesive 70. As such, the bottom drain terminal 13 of the molded chip 10 is directly electrically connected to the external devices by the die paddle 41 and the contact part 42 of the lead frame 40.

Figure 19:
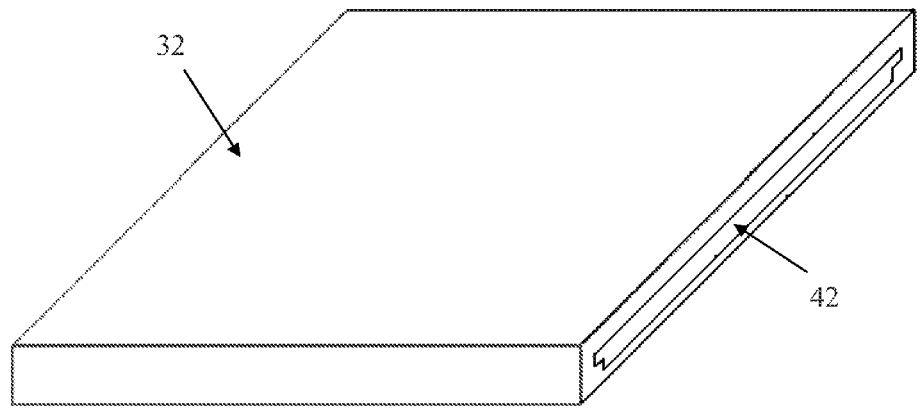

As shown in FIG. 19, a second plastic package body 32 is formed to cover the molded chip 10 and the lead frame 40, including at least the side surface at the second side and fourth side of the lead frame and the bottom surface of the two contact parts 42, where only the side surfaces of the two contact parts 42 and the bottom surface of the die paddle of the lead frame 40 are exposed.

Figure 20:
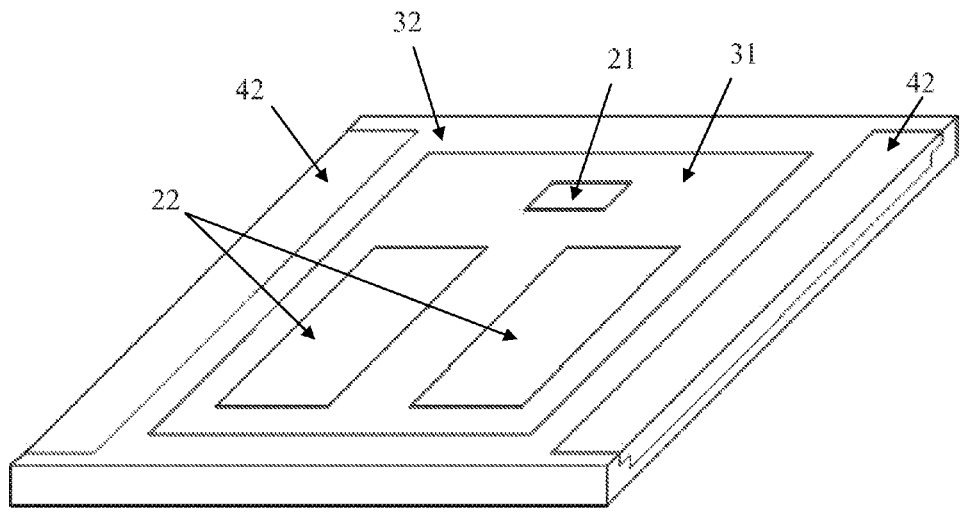

As shown in FIG. 20, the top surface of the packaging structure is ground until the contact bodies 21 and 22 at the top gate terminal 11 and the top source terminal 12 on the chip 10 and the top surfaces of the two contact parts 42 on the lead frame 40 are exposed outside of the second plastic package body 32. The grinding process also forces the top surfaces of the contact bodies 21 and 22 and contact parts 42 into coplanar without the strict alignment requirement in mounting the semiconductor chip of prior arts.

As shown in FIG. 2, the bottom surface of the die paddle 41 connecting to the drain terminal 13 at the bottom of the chip 10 is exposed for heat dissipation.

Figure 12:
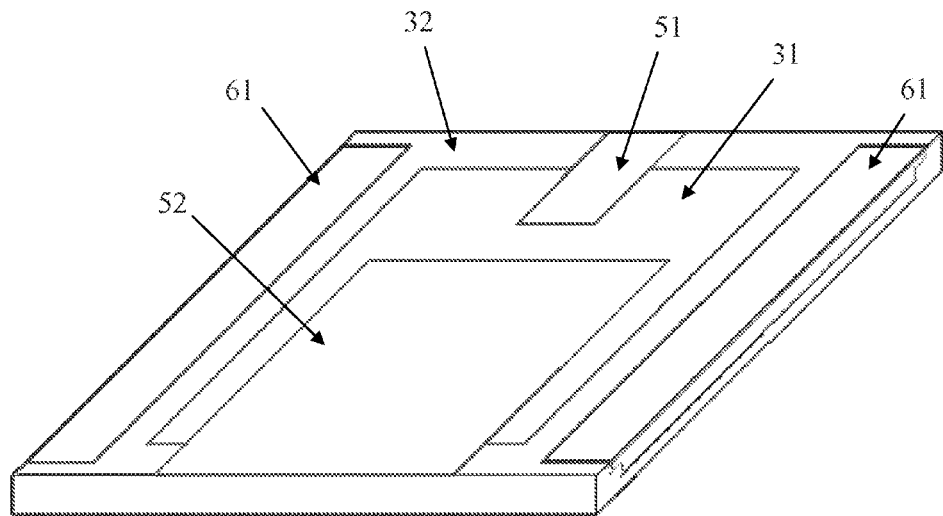
Figure 21:
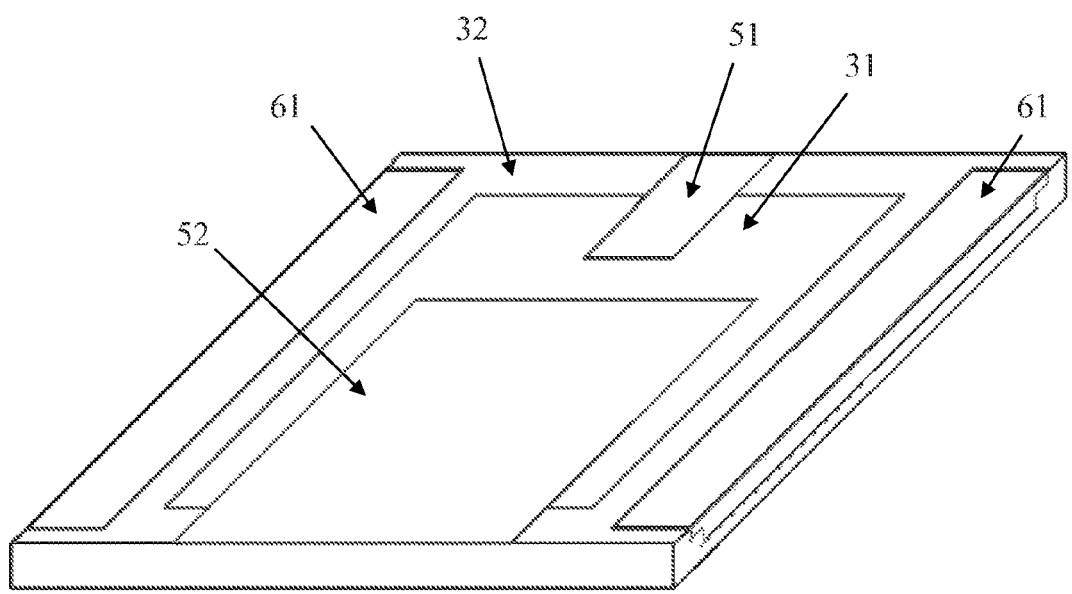

FIG. 21 is similar to FIG. 12, in which solderable metal pads are plated on the top surface of the packaging structure at the top surfaces of contact bodies 21 and 22 and the contact part 42 to re-pattern the package external connection between the corresponding terminal on the chip 10 and the external device. The location of the plated metal pads on the top surface of the packaging structure depends on the desired application of the device.

The volume of the packaged device with the wafer level substrate-less MOSFET chip made by the methods of the present invention is effectively reduced. The packaged device include a semiconductor chip 10 with a top source terminal 12 electrically connected to the contact body 22 and the source contact pad 52, a top gate terminal 11 electrically connected to the contact body 21 and the gate contact pad 51, a drain 13 terminal at the bottom of the chip 10 electrically connected to a die paddle 41 and the contact part 42 of the lead frame 40 as well as a drain contact pad 61 formed on the contact part 42. The gate contact pad 51, the source contact pad 52 and the drain contact pad 61 are insulated and separated by the first plastic package body 31 and the second plastic package body 32. The top surfaces of the packaging structures with these contact pads are flush and used as the back side (FIG. 3) of a power device facing downward in the actual application for electrically connecting to the external devices. The re-pattern circuit on the surface of the packaging structure can be formed by changing the locations of the contact pads. The bottom surfaces of the packaging structures with the bottom surface of the die paddle 41 of the lead frame 40 being exposed is used as the top side (FIG. 2) of the power device facing upward in the actual application for the electrical connection to the external devices and also for improving the heat dissipation of the device.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A fabrication method of a semiconductor device is characterized by comprising the following steps:

Step 1, forming a plurality of semiconductor chips on a semiconductor wafer, wherein each semiconductor chip includes a first top terminal and a second top terminal arranged at a top surface of the semiconductor wafer and a bottom terminal arranged at a bottom portion of the semiconductor wafer;

Step 2, forming a conductive contact body on each top terminal at the top surface of the semiconductor wafer corresponding to each top terminal respectively;

Step 3, molding the top surface of the wafer to form a first plastic package body covering top surfaces of each semiconductor chip and at least sidewalls of each contact body;

Step 4, grinding a bottom surface of the molded semiconductor wafer to a predetermined wafer thickness and cutting the ground semiconductor wafer to separate individual molded chips;

Step 5, providing a conductive lead frame, wherein the lead frame comprises a die paddle surrounded by a periphery with opposite first side and third side and opposite second side and fourth side and a contact part formed at each of the first side and the third side of the lead frame connecting to the die paddle, wherein a top surface of the contact part is higher than a top surface of the die paddle;

Step 6, mounting the bottom surface of a molded semiconductor chip onto the top surface of the die paddle of the lead frame such that the bottom terminal of the semiconductor chip is electrically connected to the die pad;

Step 7, molding the lead frame connected with the chip with a second plastic package body such that top surfaces of the contact body of each top terminal on the semiconductor chip and the contact part of the lead frame are respectively exposed outside a top surface of the second plastic package body for external electric connection, and a bottom surface of the die paddle on the lead frame is exposed outside of a bottom surface of the second plastic package body for heat dissipation;

Step 8, forming a patterned metal plating layer as external connection pads of the corresponding terminals on a top surface of the overall packaging structure including the exposed surfaces of each contact body and the contact part, wherein a first pad in electric connection with the contact part respectively extends to edges of the first side and the third side, a second pad in electric connection with the first top terminal extends to an edge of the second side but terminates far away from the edges of the first side and the third side, and a third pad in electric connection with the second top terminal extends to an edge of the fourth side but terminates far away from the edges of the first side and the third side.

2. The fabrication method according to claim 1 is characterized in that:

In step 1, the semiconductor chip is a MOSFET (Metal-Oxide-Semiconductor Field Effect Transistor) chip provided with a top gate, a top source and a bottom drain.

3. The fabrication method according to claim 1 is characterized in that:

In step 2, the contact body on the corresponding top terminal and protruding from the top surface of the chip is formed by ball dropping or wafer bumping.

4. The fabrication method according to claim 3 is characterized in that:

The thickness of the ground wafer is 1 mil or below.

5. The fabrication method according to claim 1 is characterized in that:

In step 8, the first pad in electric connection with the contact part respectively extends to the edges of the first side and the third side but terminates far away from the edges of the second side and the fourth side; and notches are formed by half-etch respectively on a bottom face at four corners of the lead frame; the notches are filled by the second plastic package body in step 7.

6. The fabrication method according to claim 1 is characterized in that:

an area of the die paddle of the lead frame is larger than an area of the semiconductor chip, and a space beyond the semiconductor chip of the die paddle is filled by the second plastic package body.

7. The fabrication method according to claim 1 is characterized in that:

In step 7, the top surfaces of the semiconductor chip and the lead frame are completely covered by a molding compound; the top surfaces of the contact body and the contact part are exposed outside of the top surfaces of the first plastic package body and the second plastic package body by grinding a top surface of the molding compound; and moreover, the top surfaces of the contact body, the contact part and the second plastic package body are coplanar.

8. The fabrication method according to claim 1 is characterized by:

Before grinding the bottom surface of the molded semiconductor wafer in step 4, grinding a top surface of the molded semiconductor wafer, so as to expose the top surface of the contact body on each chip;

Before forming the second plastic package body in step 7, covering adhesive tapes on the top surface of the chip and the contact part of the lead frame, so as to protect the surface of the contact body and the contact part during molding; moreover, de-flashing or grinding the top surface of the molding, so that the top surfaces of the contact body and the first plastic package body on the chip and the top surfaces of the contact part and the second plastic package body are coplanar.

\* \* \* \* \*